US012652922B2

(12) United States Patent
Hwang et al.

(10) Patent No.: US 12,652,922 B2
(45) Date of Patent: Jun. 9, 2026

(54) DISPLAY DEVICE INCLUDING SPACERS CAPPED WITH ORGANIC PATTERNS

(71) Applicant: LG Display Co., Ltd., Seoul (KR)

(72) Inventors: Joohwan Hwang, Paju-si (KR); Youngjune Go, Paju-si (KR); Wooseok Noh, Paju-si (KR); Hyejin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 663 days.

(21) Appl. No.: 18/073,337

(22) Filed: Dec. 1, 2022

(65) Prior Publication Data

US 2023/0209955 A1 Jun. 29, 2023

(30) Foreign Application Priority Data

Dec. 23, 2021 (KR) ........................ 10-2021-0186169

(51) Int. Cl.

*H10K 59/35* (2023.01)
*H10K 50/844* (2023.01)
*H10K 59/122* (2023.01)
*H10K 59/12* (2023.01)

(52) U.S. Cl.

CPC ......... *H10K 59/353* (2023.02); *H10K 50/844* (2023.02); *H10K 59/122* (2023.02); *H10K 59/12* (2023.02)

(58) Field of Classification Search

CPC .. H10K 59/353; H10K 59/122; H10K 59/873; H10K 59/121; H10K 59/8723; H10K 59/35; H10K 59/12; H10K 50/844; H10K 50/841

See application file for complete search history.

(56) References Cited

U.S. PATENT DOCUMENTS 6,559,604 B2 * 5/2003 Lu ........................ H10K 59/173 313/506
6,616,496 B1 * 9/2003 Lu ........................ H10K 59/173 445/24
9,337,244 B2 * 5/2016 Hatano ............. H10K 59/8723

(Continued)

FOREIGN PATENT DOCUMENTS

CN 106328671 A 1/2017
CN 106601768 A 4/2017

(Continued)

OTHER PUBLICATIONS

Office Action issued in corresponding Taiwanese Patent Application No. 10-2021-0186169, dated Mar. 13, 2025. (Note: KR 10-2021-0070667 A was previously cited.).

(Continued)

*Primary Examiner* — Ida M Soward
(74) *Attorney, Agent, or Firm* — Morgan, Lewis & Bockius LLP

(57) ABSTRACT

A display device includes a substrate having at least two transmissive areas and a non-transmissive area disposed between the at least two transmissive areas; a subpixel in the non-transmissive area, the subpixel including a first electrode, a light emitting layer, and a second electrode; at least two spacers each in respective ones of the at least two transmissive areas; and at least two organic patterns on upper surfaces of respective ones of the at least two spacers.

20 Claims, 9 Drawing Sheets

(56) References Cited

U.S. PATENT DOCUMENTS

| | | | | |
|---|---|---|---|---|
| 9,373,809 | B2 * | 6/2016 | Adachi | H10K 59/80516 |
| 10,840,317 | B2 | 11/2020 | Oh et al. | |
| 11,043,543 | B2 * | 6/2021 | Yoshizumi | H10K 59/131 |
| 11,296,156 | B2 * | 4/2022 | Kim | H10K 50/805 |
| 2001/0054867 | A1 * | 12/2001 | Kubota | H10K 59/873 313/504 |
| 2005/0237780 | A1 * | 10/2005 | Sakai | H10K 59/80523 365/111 |
| 2005/0285512 | A1 * | 12/2005 | Murayama | H10K 50/805 313/504 |
| 2007/0194307 | A1 * | 8/2007 | Kim | H10K 50/82 257/40 |
| 2008/0074041 | A1 * | 3/2008 | Nakayama | H10K 59/122 445/24 |
| 2009/0009069 | A1 * | 1/2009 | Takata | H10K 50/824 445/24 |
| 2009/0015153 | A1 * | 1/2009 | Asano | H05B 33/04 313/504 |
| 2010/0051992 | A1 * | 3/2010 | Kobayashi | H10K 59/173 257/40 |
| 2011/0204369 | A1 | 8/2011 | Ha et al. | |
| 2011/0241562 | A1 | 10/2011 | Choi et al. | |
| 2012/0228603 | A1 * | 9/2012 | Nakamura | H10K 50/824 257/40 |
| 2013/0248867 | A1 * | 9/2013 | Kim | H10K 59/873 438/34 |
| 2016/0043341 | A1 | 2/2016 | Heo et al. | |
| 2017/0005292 | A1 | 1/2017 | Lee et al. | |
| 2017/0012240 | A1 * | 1/2017 | Nakajima | H10K 50/844 |
| 2019/0058020 | A1 * | 2/2019 | Tsai | G06F 3/044 |
| 2020/0027936 | A1 * | 1/2020 | Wang | H10K 59/122 |
| 2020/0212116 | A1 * | 7/2020 | Kim | G06F 3/04166 |
| 2021/0175459 | A1 * | 6/2021 | Lee | H10K 59/88 |
| 2021/0175477 | A1 | 6/2021 | Lim et al. | |
| 2021/0192170 | A1 * | 6/2021 | Ma | G06V 10/141 |
| 2021/0202588 | A1 | 7/2021 | Cho et al. | |
| 2022/0077250 | A1 * | 3/2022 | Tang | H10K 50/818 |
| 2024/0298493 | A1 * | 9/2024 | Wang | H10K 71/166 |

FOREIGN PATENT DOCUMENTS

| | | | | |
|---|---|---|---|---|
| CN | 109427846 | A | 3/2019 | |
| CN | 111900194 | A * | 11/2020 | H10K 71/00 |
| CN | 112928139 | A | 6/2021 | |
| EP | 3346501 | A1 | 7/2018 | |
| EP | 3866207 | A1 | 8/2021 | |
| JP | 2009230990 | A * | 10/2009 | H05B 33/22 |
| KR | 10-2007-0121285 | A | 12/2007 | |
| KR | 10-2011-0111746 | A | 10/2011 | |
| KR | 20170003768 | A * | 1/2017 | H10K 59/8731 |
| KR | 10-2019-0057550 | A | 5/2019 | |
| KR | 10-2020-0006206 | A | 1/2020 | |
| KR | 2020-0102580 | A | 9/2020 | |
| KR | 2021-0070667 | A | 6/2021 | |

OTHER PUBLICATIONS

Office Action issued in corresponding Taiwanese Patent Application No. 11221085170, dated Oct. 30, 2023. (Note: US 2011/0204369 A1 and EP 3346501 A1 have been previously cited).

Extended European Search Report issued in corresponding EP Patent Application No. 22211167.6.

Office Action issued in corresponding Chinese Patent Application No. 202211537312.7, dated May 24, 2025. (Note: US 2005/0285512 A1 and EP 3346501 A1 were previously cited.).

Office Action dated Sep. 12, 2025, issued in corresponding European Patent Application No. 22211167.6.

* cited by examiner

DISPLAY DEVICE INCLUDING SPACERS CAPPED WITH ORGANIC PATTERNS

CROSS-REFERENCE TO RELATED APPLICATIONS

This application claims the benefit of the Korean Patent Application No. 10-2021-0186169 filed on Dec. 23, 2021, which is hereby incorporated by reference as if fully set forth herein.

BACKGROUND

Technical Field

The present disclosure relates to a display device.

Discussion of the Related Art

A display device has been devised to be applied in various applications by embedding a camera therein to link a display area to the camera. In such a display device, the camera may be disposed below a display panel. In this way, the display device embedded with a camera may not display an image in an area overlapped with the camera, and in this case, the image displayed on the display device may be disconnected and recognized by a user.

Recently, to solve this problem, studies for a display panel have been actively made in which a display area for displaying an image includes a transmissive area capable of transmitting external light and a non-light transmissive area and in which the transmissive area has high light transmittance.

SUMMARY

Accordingly, embodiments of the present disclosure are directed to a display device that substantially obviates one or more of the problems due to limitations and disadvantages of the related art.

An aspect of the present disclosure is to provide a display device that may have high light transmittance in a display area.

Another aspect of the present disclosure is to provide a display device that may safely remove a protective film without damage of a display panel during a manufacturing process.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate having at least two transmissive areas and a non-transmissive area disposed between the at least two transmissive areas; a subpixel in the non-transmissive area, the subpixel including a first electrode, a light emitting layer, and a second electrode; at least two spacers each in respective ones of the at least two transmissive areas; and at least two organic patterns on upper surfaces of respective ones of the at least two spacers.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
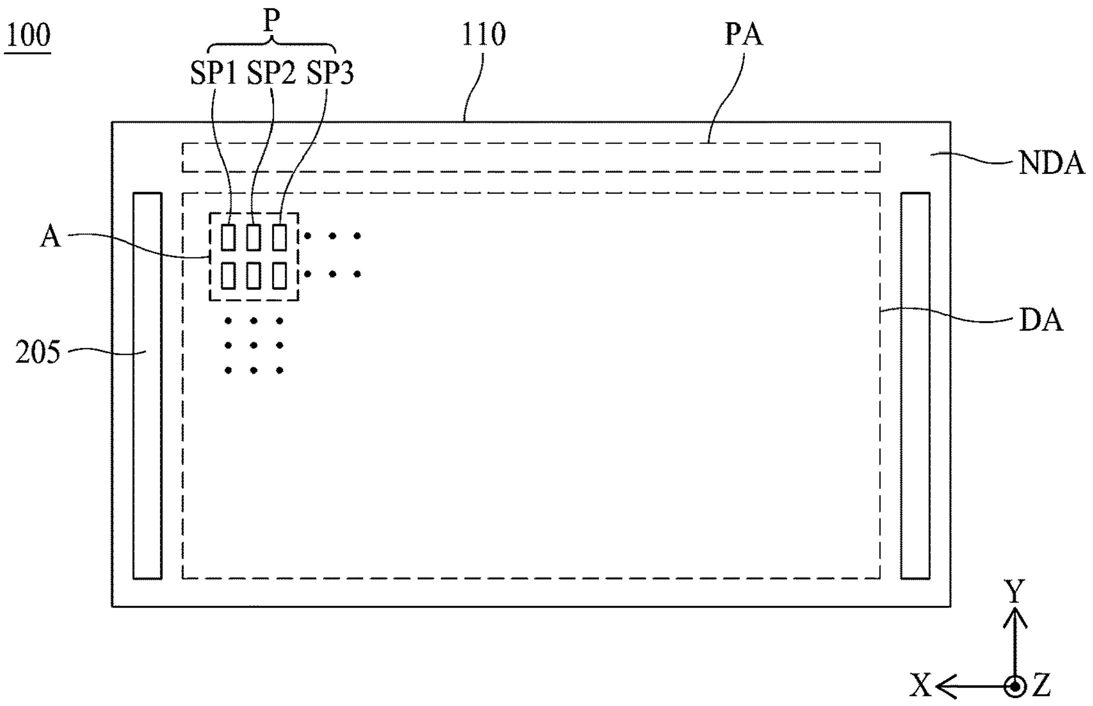
FIG. 1 is a schematic plan view illustrating a display device according to one example embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

FIG. 1 is a schematic plan view illustrating a display device according to an example embodiment of the present disclosure.

Hereinafter, an X axis indicates a line parallel with a scan line, a Y axis indicates a line parallel with a data line, and a Z axis indicates a height direction of a transparent display device 100. Although a description has been described based on that the transparent display device 100 according to one example embodiment of the present disclosure embodied as an organic light emitting display device, the transparent display device 100 may be embodied as a liquid crystal display device, a plasma display panel (PDP), a Quantum dot Light Emitting Display (QLED), or an Electrophoresis display device.

With reference to FIG. 1, a display device 100 according to one example embodiment of the present disclosure includes a display panel 110. The display panel 110 according to one embodiment of the present disclosure may be categorized into a display area DA in which pixels are provided to display an image and a non-display area NDA in which an image is not displayed. The display area DA may include scan lines, data lines, and pixels P, and the non-display area NDA may include a pad area PA in which pads are disposed, and at least one gate driver 205.

The data lines may be extended in a first direction (e.g., a Y-axis direction) in the display area DA. The scan lines may be extended in a second direction (e.g., a X-axis direction) in the display area DA, and may cross the data lines. The pixels P include a plurality of subpixels SP1, SP2 and SP3, and are provided in intersection areas where the data lines cross the scan lines, to emit predetermined light, thereby displaying an image.

The gate driver 205 is connected to the scan lines to supply scan signals. The gate driver 205 may be provided in the non-display area NDA outside one side or both sides of the display area DA of the display panel 110 in a gate driver in panel (GIP) method or a tape automated bonding (TAB) method.

Figure 2:
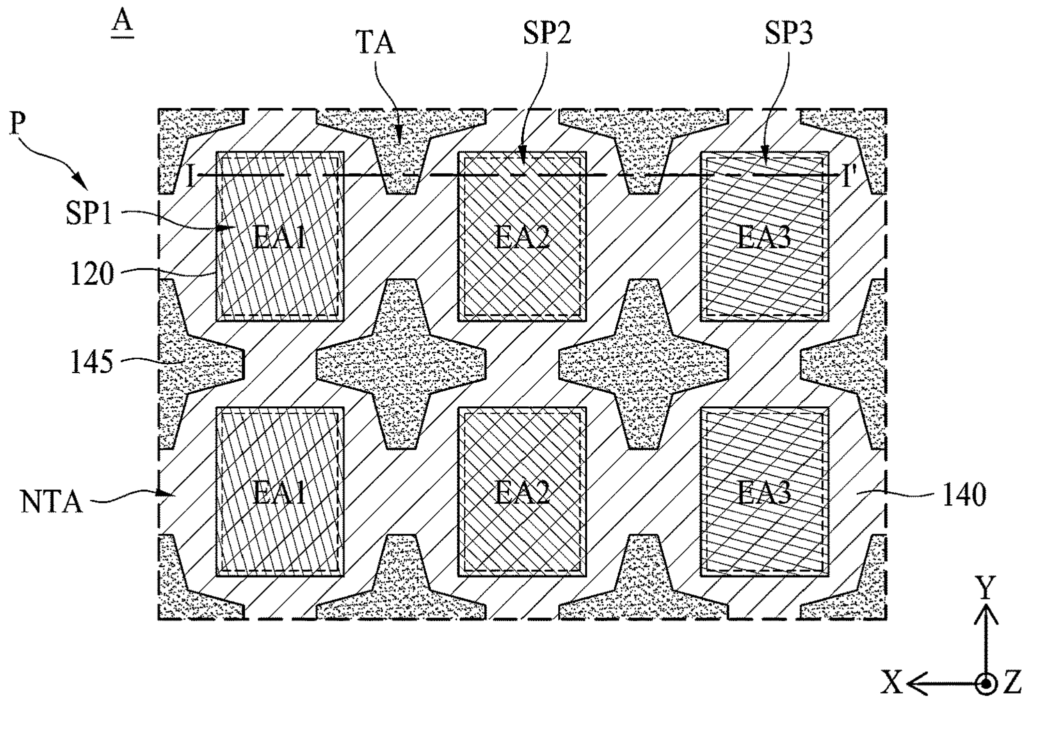
FIG. 2 is a schematic view illustrating an example of a pixel provided in an area A of FIG. 1.
Figure 3:
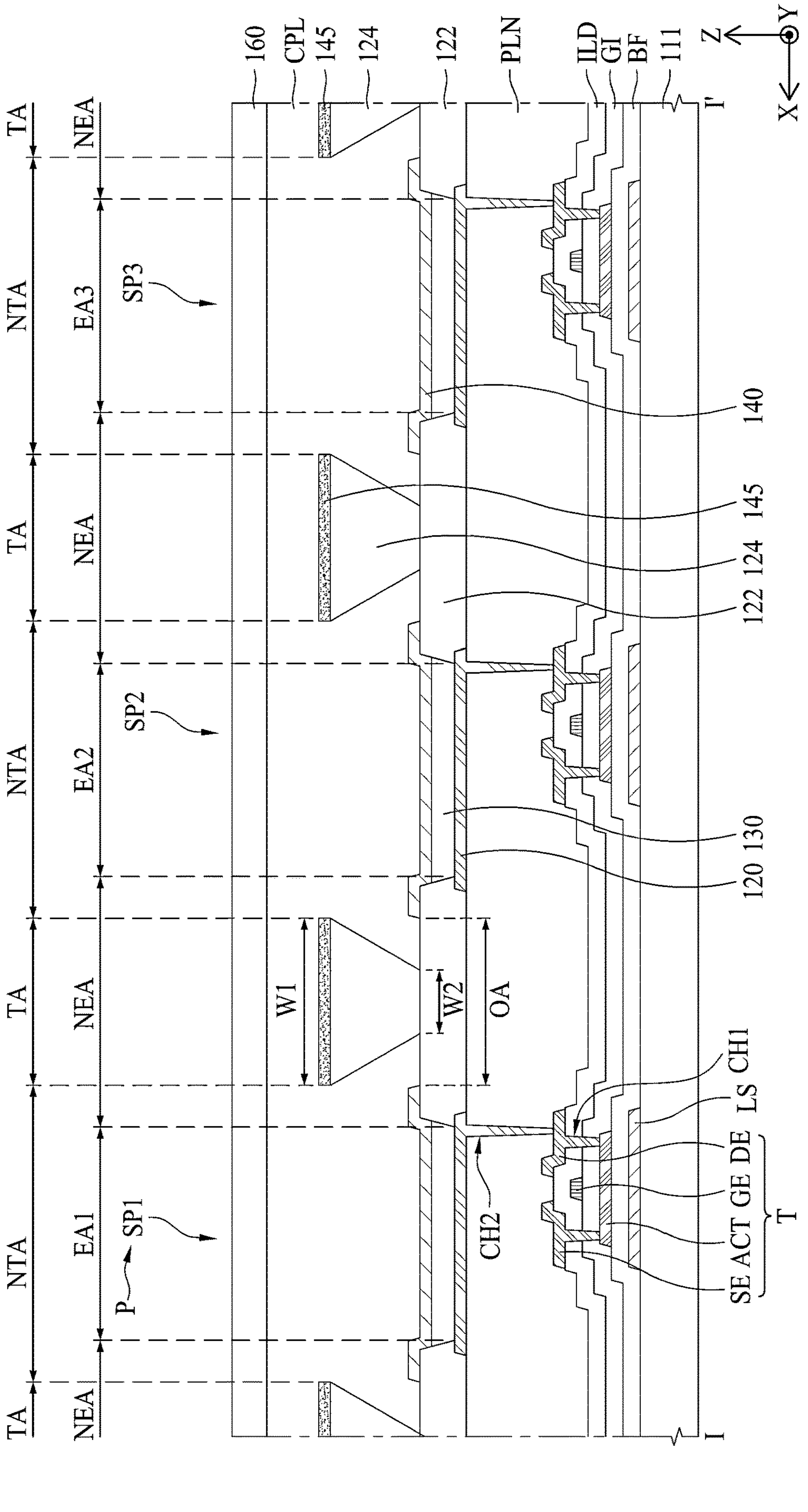
FIG. 3 is a cross-sectional view illustrating an example structure along line I-I' of FIG. 2.
Figure 4:
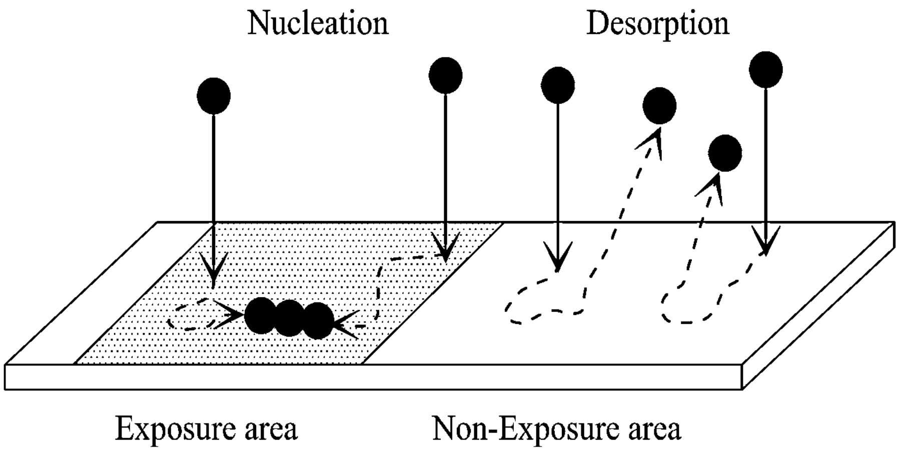
FIG. 4 is an exemplary view illustrating a case that an organic pattern material is exposed to light and a case that the organic pattern material is not exposed to light.
Figure 5:
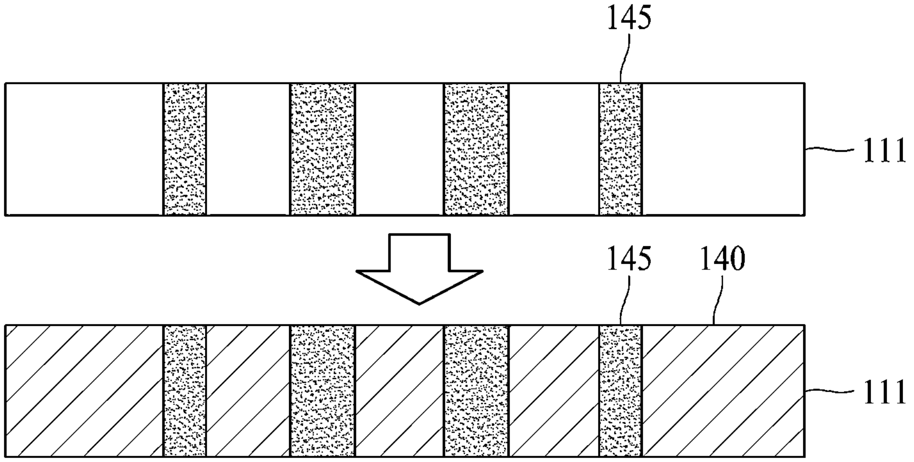
FIG. 5 is a view illustrating an example of metal patterning using an organic pattern material.
Figure 6A:
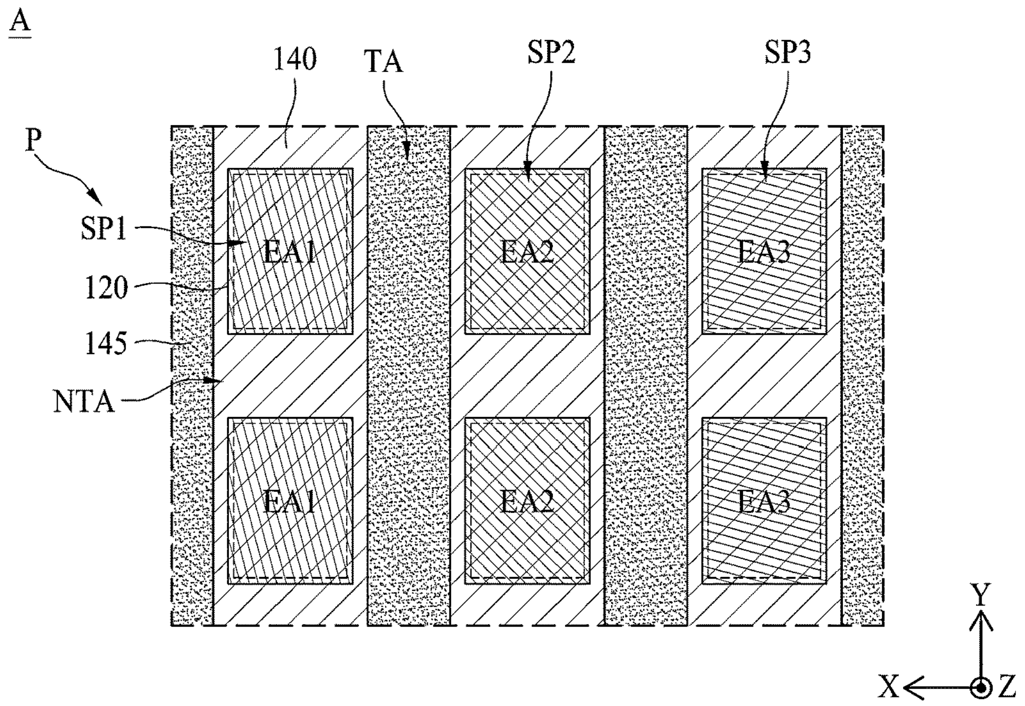
FIG. 6A is a view illustrating a modified shape of a plurality of organic patterns.
Figure 6B:
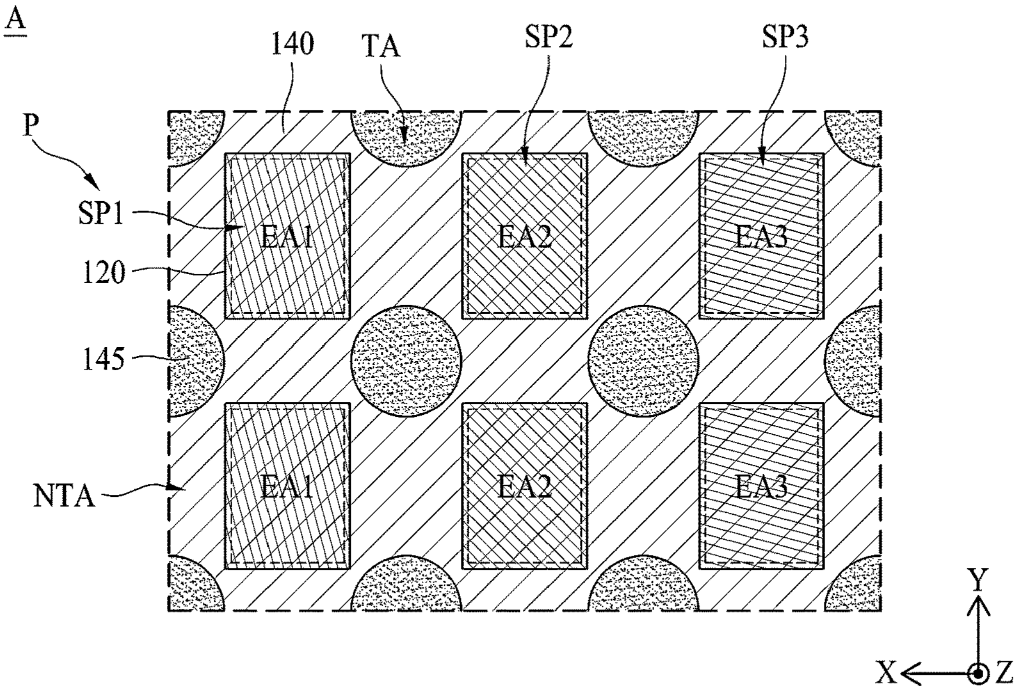
FIG. 6B is a view illustrating another modified shape of a plurality of organic patterns.
Figure 7:
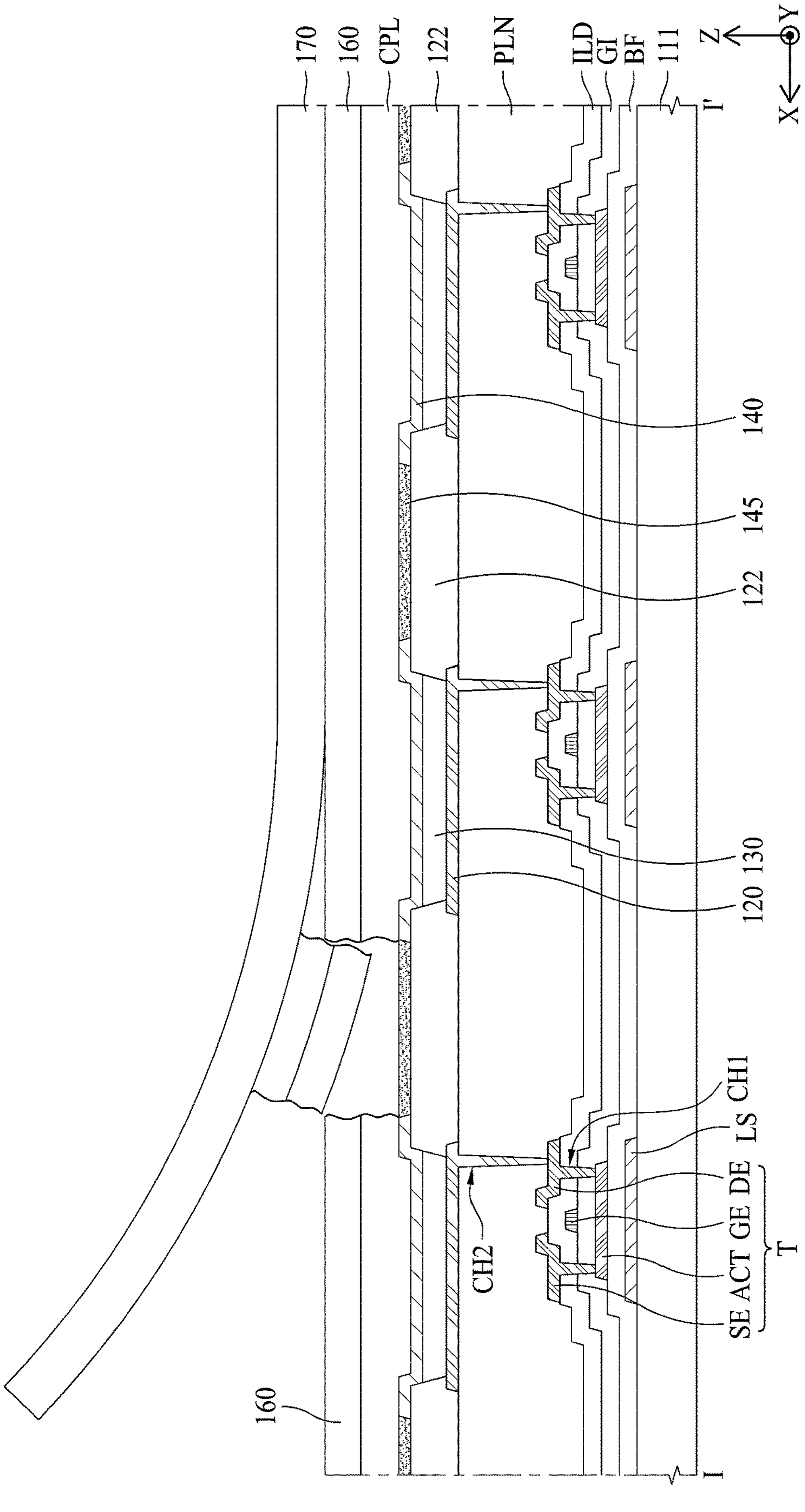
FIG. 7 is a view illustrating an example that an encapsulation layer is separated from organic patterns when a protective film is removed.
Figure 8:
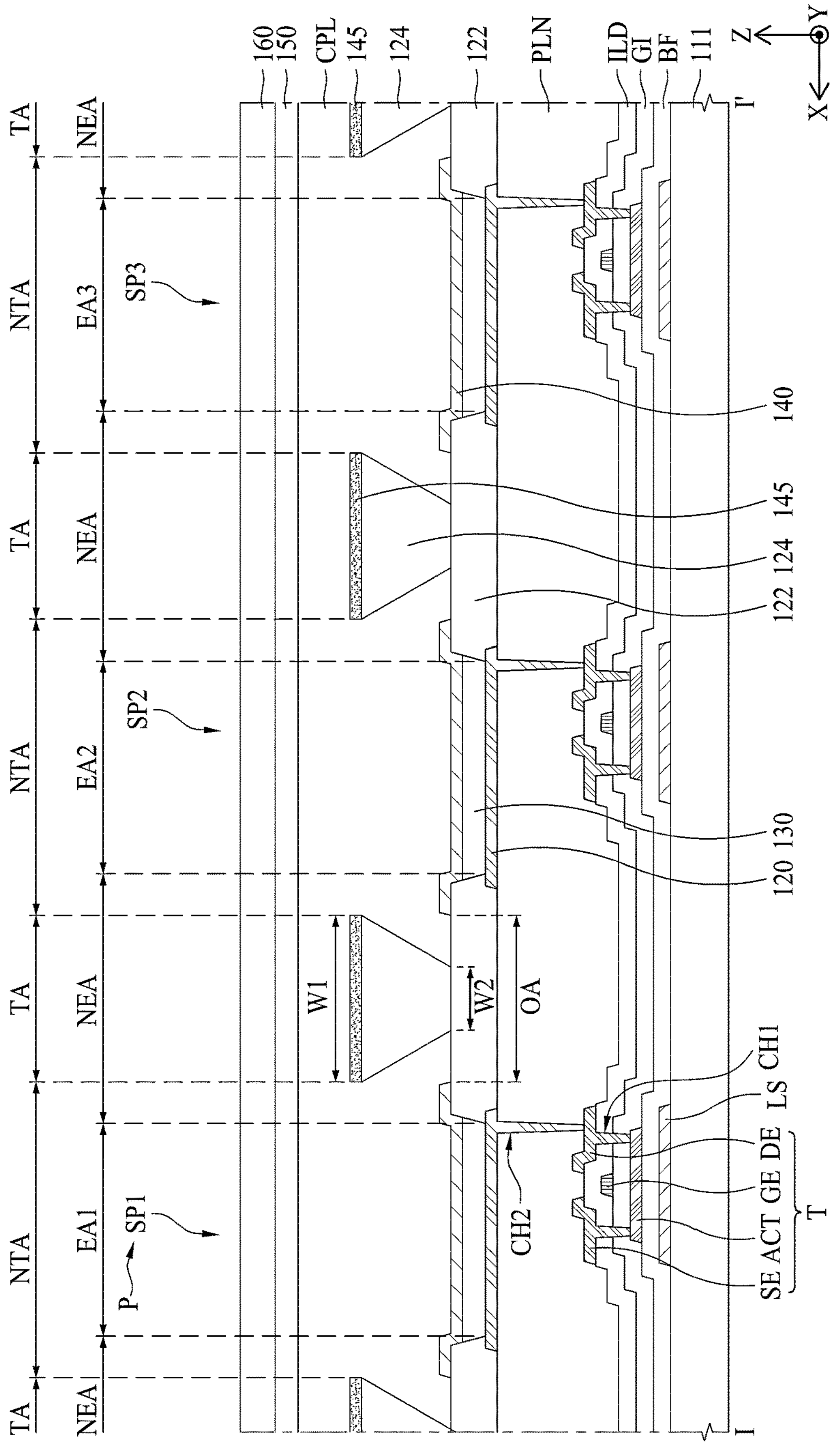
FIG. 8 is a cross-sectional view illustrating another example structure along line I-I' of FIG. 2.
Figure 9:
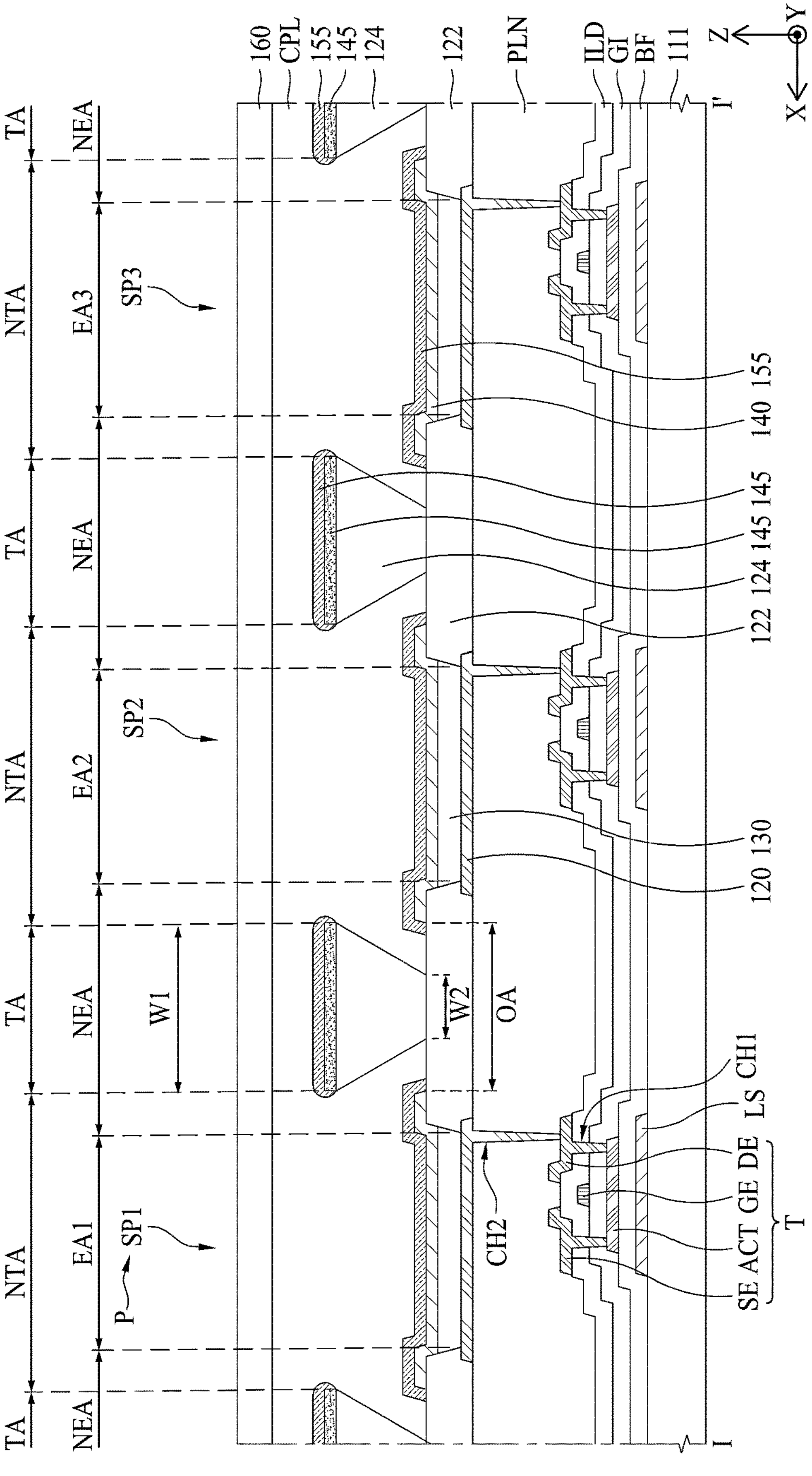
FIG. 9 is a cross-sectional view illustrating other example structure along line I-I' of FIG. 2.

FIG. 2 is a schematic view illustrating an example of a pixel provided in an area A of FIG. 1, FIG. 3 is a cross-sectional view illustrating an example structure along line I-I' of FIG. 2, FIG. 4 is an exemplary view illustrating a case that an organic pattern material is exposed to light and a case that the organic pattern material is not exposed to light, FIG. 5 is a view illustrating an example of metal patterning using an organic pattern material, FIG. 6A is a view illustrating a modified shape of a plurality of organic patterns, FIG. 6B is a view illustrating another modified shape of a plurality of organic patterns, FIG. 7 is a view illustrating an example that an encapsulation layer is separated from organic patterns when a protective film is removed, FIG. 8 is a cross-sectional view illustrating another example structure along line I-I' of FIG. 2, and FIG. 9 is a cross-sectional view illustrating another example structure along line I-I' of FIG. 2.

With reference to FIGS. 2 to 9, the display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, a is greater than β. A user may view an object or background arranged over a rear surface of the display panel 110 due to the transmissive area TA.

The non-transmissive area NTA may be disposed between the transmissive areas TA and include a plurality of pixels P. Pixels P may be provided in an area where the data lines and the scan lines intersect, and emit predetermined light to display an image. An emission area EA may correspond to an area, from which light is emitted, in the pixel P.

Each of the pixels P may include at least one of a first subpixel SP1, a second subpixel SP2, and a third subpixel SP3. The first subpixel SP1 may include a first emission area EA1 emitting light of a first color. The second subpixel SP2 may include a second emission area EA2 emitting light of a second color. The third subpixel SP3 may include a third emission area EA3 emitting light of a third color. In the display panel 110 according to one embodiment of the present disclosure, each of the pixels P may further include a fourth subpixel including a fourth emission area emitting light of a fourth color.

The first to fourth emission area EA1, EA2 and EA3 may emit light of different colors. For example, the first emission area EA1 may emit light of a green color. The second emission area EA2 may emit light of a red color. The third emission area EA3 may emit light of a blue color. The fourth emission area may emit light of a white color. However, the emission areas are not limited to this example. Two of the first to fourth emission area EA1, EA2 and EA3 may emit light of the same color. For example, the first emission area EA1 and the fourth emission area may emit light of a green color. Also, the arrangement order of the subpixels SP1, SP2 and SP3 may be changed in various ways.

A circuit element, which includes a capacitor, a thin film transistor and the like, and a light emitting element may be provided in each of the first subpixel SP1, the second subpixel SP2 and the third subpixel SP3. The thin film transistor may include a switching transistor, a sensing transistor, and a driving transistor T.

The switching transistor may be switched in accordance with the scan signal supplied to the scan line to charge the data voltage supplied from the data line in the capacitor. The sensing transistor may sense a threshold voltage deviation of the driving transistor T, which may cause deterioration of image quality.

The driving transistor T is switched in accordance with the data voltage charged in the capacitor to generate a data current from a power source supplied from a pixel power line to supply the data current to a first electrode 120 of the subpixels SP1, SP2 and SP3. The driving transistor T may include an active layer ACT, a gate electrode GE, a source electrode SE and a drain electrode DE.

In detail, a light shielding layer LS may be provided over the first substrate 111. The light shielding layer LS serves to shield external light incident on the active layer ACT in the area where the driving transistor T is provided. The light shielding layer LS may be formed of a single layer or multiple layers made of any one of molybdenum (Mo), aluminum (Al), chromium (Cr), gold (Au), titanium (Ti), nickel (Ni), neodymium (Nd) and copper (Cu) or their alloy.

A buffer layer BF may be provided over the light shielding layer LS. The buffer layer BF is for protecting the transistors T from water permeated through the first substrate 111 vulnerable to moisture permeation, and may be formed of an inorganic layer, for example, a silicon oxide layer (SiOx), a silicon nitride layer (SiNx), or multiple layers of SiOx and SiNx.

The active layer ACT may be provided over the buffer layer BF. The active layer ACT may be formed of a silicon-based semiconductor material or an oxide-based semiconductor material.

A gate insulating layer GI may be provided over the active layer ACT. The gate insulating layer GI may be formed of an inorganic layer, for example, a silicon oxide layer (SiOx), a silicon nitride layer (SiNx), or multiple layers of SiOx and SiNx.

A gate electrode GE may be provided over the gate insulating layer GI. The gate electrode GE may be formed of a single layer or multiple layers made including at least one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic layer, for example, a silicon oxide layer (SiOx), a silicon nitride layer (SiNx), or multiple layers of SiOx and SiNx.

The source electrode SE and the drain electrode DE may be provided over the interlayer dielectric layer ILD. One of the source electrode SE and the drain electrode DE may be connected to the active layer ACT through a first contact hole CH1 that passes through the gate insulating layer GI and the interlayer dielectric layer ILD. The source electrode SE and the drain electrode DE may be formed of a single layer or multiple layers including at least one of molybdenum (Mo), aluminum (Al), chromium (Cr), gold (Au), titanium (Ti), nickel (Ni), neodymium (Nd) and copper (Cu), or their alloy.

A planarization layer PLN for planarizing a step difference due to the driving transistor T may be provided over the source electrode SE and the drain electrode DE. The planarization layer PLN may be formed of an organic layer such as an acrylic resin, an epoxy resin, a phenolic resin, a polyamide resin, and a polyimide resin.

A light emitting element, which includes a first electrode 120, an organic light emitting layer 130 and a second electrode 140, a bank 122, a plurality of spacers 124 and a plurality of organic patterns 145 may be provided over the planarization layer PLN.

The first electrode 120 may be provided over the planarization layer PLN for each of the subpixels SP1, SP2 and SP3. The first electrode 120 may be connected to the driving transistor T. In detail, the first electrode 120 may be connected to one of the source electrode SE and the drain electrode DE of the driving transistor T through a second contact hole CH2 that passes through the planarization layer PLN.

The first electrode 120 may be formed of a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode.

The bank 122 may be provided between the subpixels SP1, SP2 and SP3 over the planarization layer PLN. At least a portion of the bank 122 may overlap the plurality of the transmissive areas TA. Another portion of the bank 122 may overlap the non-transmissive area NTA. The bank 122 may be formed to at least partially cover an edge of the first electrode 120 and expose a portion of the first electrode 120. Therefore, the bank 122 may prevent a problem in which light emitting efficiency is deteriorated due to concentration of a current on an end of the first electrode 120.

The bank 122 may define light emission areas EA1, EA2 and EA3 of the subpixels SP1, SP2 and SP3. The light emission areas EA1, EA2 and EA3 of each of the subpixels SP1, SP2 and SP3 represent an area in which the first electrode 120, the light emitting layer 130 and the second electrode 140 are sequentially stacked and holes from the first electrode 120 and electrons from the second electrode 140 are combined with each other in the light emitting layer 130 to emit light. In this case, the area in which the bank 122 is provided may become the non-light emission area NEA because light is not emitted therefrom, and the area in which the bank 122 is not provided and the first electrode 120 is exposed may become the light emission area EA. The bank 122 may include an organic layer, such as an acrylic resin, an epoxy resin, a phenolic resin, a polyamide resin, and a polyimide resin.

The plurality of spacers 124 may be provided to be spaced apart from each other on a bank 122. Each of the plurality of spacers 124 may be provided in each of a plurality of transmissive areas TA, and its upper surface may have a reverse taper structure wider than that of a lower surface. Each of the plurality of spacers 124 may have a first width W1 of the upper surface, which is greater than a second width W2 of the lower surface. Therefore, a portion of an upper surface of the bank 122, which is provided in an area overlapped with the plurality of spacers 124, may be exposed below the upper surface of each of the plurality of spacers 124. The plurality of spacers 124 may include an organic layer, such as an acrylic resin, an epoxy resin, a phenolic resin, a polyamide resin, and a polyimide resin.

The plurality of organic patterns 145 may be provided on the upper surface of each of the plurality of spacers 124. Each of the plurality of organic patterns 145 may have the same shape as that of the upper surface of each of the plurality of spacers 124. For example, the upper surface of each of the plurality of spacers 124 may have a cross shape as shown in FIG. 2. Each of the plurality of organic patterns 145 may be formed in the same cross shape as that of the upper surface of each of the plurality of spacers 124 on the upper surface of each of the plurality of spacers 124. In this case, each of the plurality of organic patterns 145 may be formed in the same area as that of each of the plurality of spacers 124. In this case, the same area may represent substantially the same area.

Upper surfaces of the plurality of organic patterns 145 and the plurality of spacers 124 may have a cross shape as shown in FIG. 2, but are not limited thereto. A shape of the upper surface of each of the plurality of organic patterns 145 and the plurality of spacers 124 may vary depending on a shape and aperture ratio of the pixel P. The upper surfaces of the plurality of organic patterns 145 and the plurality of spacers 124 may be provided between the plurality of subpixels SP1, SP2 and SP3, and may have a line shape as shown in FIG. 6A. Alternatively, the upper surface of each of the plurality of organic patterns 145 and the plurality of spacers 124 may have a circular shape as shown in FIG. 6B.

An area in which the upper surfaces of the plurality of organic patterns 145 and the plurality of spacers 124 are provided may correspond to the plurality of transmissive areas TA. A second electrode 140 may not be provided on the plurality of organic patterns 145. Therefore, the area in which the plurality of organic patterns 145 are provided may become the transmissive area TA without decrease of light transmittance by the second electrode 140.

An organic light emitting layer 130 may be provided on the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transporting layer and the electron transporting layer, respectively and are combined with each other in the light emitting layer to emit light.

In one embodiment, the light emitting layer may be formed for each of the first subpixels SP1, SP2 and SP3. For example, a green light emitting layer for emitting green light may be provided in the first subpixel SP1, a red light emitting layer for emitting red light may be provided in the second subpixel SP2, and a blue light emitting layer for emitting blue light may be provided in the third subpixel SP3.

The second electrode 140 may be provided on the organic light emitting layer 130 and the bank 122. The second electrode 140 may be provided in the non-transmissive area NTA that includes a light emission area EA. The second electrode 140 may be a common layer that is commonly formed in the subpixels SP1, SP2 and SP3 to apply the same voltage.

The second electrode 140 may include a semi-transmissive conductive material, such as magnesium (Mg), silver (Ag) or an alloy of magnesium (Mg) and silver (Ag). Therefore, the second electrode 140 may increase light emitting efficiency by a micro cavity. The second electrode 140 may be a cathode electrode.

The second electrode 140 may include an opening area OA overlapped with the plurality of transmissive areas TA. In detail, the second electrode 140 is not provided on the plurality of organic patterns 145 provided in the plurality of transmissive areas TA, but may be provided in an area except the area where the plurality of organic patterns 145 and the plurality of spacers 124 are provided.

The display panel 110 according to one embodiment of the present disclosure prevents the second electrode 140 from being formed on the upper surface of each of the plurality of organic patterns 145 using characteristics of the material constituting the plurality of organic patterns 145.

The plurality of organic patterns 145 may be formed of a material that enables desorption of a metal material. In detail, the material constituting the plurality of organic patterns 145 may be an organic material having a low surface energy of the material itself or a high interface energy between metal materials. An organic material having the above-described characteristics has a low deposition rate of a metal material due to desorption of the metal material on the surface during deposition of the metal material.

In one embodiment, the plurality of organic patterns 145 may be made of a photo-isomerization material. The photo-isomerization material is a material that is changed to another isomer of another physical or chemical properties when exposed to light such as UV, and may be, for example, a photo-chromic. The photo-chromic is a material of which color is changed when exposed to light, such as UV light, and of which color returns to its original color when light is blocked. For example, the photo-chromic may include a diarylethene-based compound that includes the following chemical formula 1.

[Chemical Formula 1]

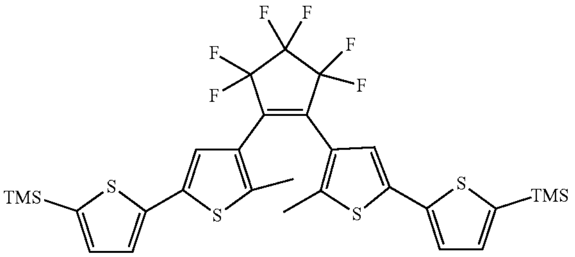

The photo-isomerization material is characterized in that a deposition rate of the metal material is different depending on whether light is exposed. In detail, the photo-isomerization material irradiated with UV has a high deposition rate of a metal material due to nucleation as shown in FIG. 4. For example, a metal material may be well deposited on the photo-isomerization material irradiated with UV. On the other hand, the photo-isomerization material that is not irradiated with UV has a low deposition rate of the metal material due to desorption as shown in FIG. 4. For example, a metal material may not be well deposited on the photo-isomerization material that is not irradiated with UV.

In the display panel 110 according to one example embodiment of the present disclosure, the second electrode 140 may be selectively patterned using characteristics of the material constituting the plurality of organic patterns 145. With reference to FIG. 5, the plurality of organic patterns 145 may be provided in a specific area of the first substrate

111. Then, when a metal material for the second electrode 140 is deposited on the first substrate 111 in which the plurality of organic patterns 145 are provided, the metal material is not provided on the plurality of organic patterns 145, and may be deposited only on an area where the plurality of organic patterns 145 are not provided.

Therefore, the second electrode 140 may be provided with an opening area OA overlapped with the plurality of organic patterns 145. Since the second electrode 140 is not provided on the plurality of organic patterns 145, the area where the plurality of organic patterns 145 are provided may be a transmissive area TA having high light transmittance.

A capping layer CPL may be provided on the light emitting elements. In detail, the capping layer CPL may be provided on the second electrode 140 and the plurality of organic patterns 145 to enhance a light extraction effect. The capping layer CPL may be made of an organic material having a hole transporting capability, but is not limited thereto.

An encapsulation layer 160 may be provided on the capping layer CPL. The encapsulation layer 160 may be provided on the capping layer CPL to cover the capping layer CPL. The encapsulation layer 160 serves to prevent oxygen or moisture from being permeated into the organic light emitting layer 130 and the second electrode 140. To this end, the encapsulation layer 160 may include at least one inorganic layer and at least one organic layer.

In the display panel 110 according to one example embodiment of the present disclosure, the capping layer CPL may be provided in the transmissive area TA as well as the non-transmissive area NTA. The capping layer CPL may be formed in the non-transmissive area NTA to at least partially cover the second electrode 140. In detail, the capping layer CPL may be formed in the non-transmissive area NTA to at least partially surround an upper surface and side surfaces of the second electrode 140.

In addition, the capping layer CPL may be formed in the transmissive area TA to at least partially cover the upper surface of each of the organic patterns 145 and the side surface of each of the spacers 124. In detail, the capping layer CPL may be formed in the transmissive area TA to at least partially surround the upper surface of each of the organic patterns 145 and the side surface of each of the spacers 124. Furthermore, the capping layer CPL may be provided on the upper surface of the bank 122, which is exposed by the spacers 124 and on which the second electrode 140 is not provided.

The capping layer CPL may be formed to at least partially surround the spacers 124 having a reverse taper structure, thereby increasing a binding force between the capping layer CPL and lower elements. In detail, since a surface energy of the material of the organic patterns 145 is low, an adhesive force between the organic patterns and the organic material as well as the metal material may be weakened. Therefore, when the capping layer CPL is deposited on the plurality of organic patterns 145, an adhesive force between the plurality of organic patterns 145 and the capping layer CPL may be weakened. As a result, the plurality of organic patterns 145 and the capping layer CPL may be separated from each other during the manufacturing process, and the second electrode 140 may be also separated or damaged when the capping layer CPL is separated.

Generally, the processes of manufacturing the display device 100 are not performed continuously. For example, the circuit element, the light emitting element, the capping layer CPL and the encapsulation layer 160 may be provided on the first substrate 111 through a continuous process. Then, the first substrate 111 in which the circuit element, the light emitting element, the capping layer CPL and the encapsulation layer 160 are provided may move in order to perform a subsequent process. In this case, in order to prevent the circuit element, the light emitting element, the capping layer CPL and the encapsulation layer 160 from being damaged, the first substrate 111 moves to a place, in which a subsequent process is performed, in a state that a protective film 170 is attached to the first substrate 111 as shown in FIG. 7. After the protective film 170 is removed from the first substrate 111, the subsequent process may be performed.

At this time, the adhesive force between the plurality of organic patterns 145 and the capping layer CPL may be smaller than that between the protective film 170 and the encapsulation layer 160. In this case, when the protective film 170 is removed, the capping layer CPL is separated from the plurality of organic patterns 145, and as shown in FIG. 7, the encapsulation layer 160 and the capping layer CPL may be removed together with the protective film 170. For this reason, the encapsulation layer 160 and the capping layer CPL may be damaged in the area where the plurality of organic patterns 145 are provided, and the second electrode 140 disposed therebelow may be exposed to external moisture and oxygen. In addition, the second electrode 140 may be also separated when the capping layer CPL is separated. Light may not be well emitted in the area where the capping layer CPL and the second electrode 140 are separated, whereby a defect of the display device 100 may occur.

To solve the above-described problem, in the display panel 110 according to one embodiment of the present disclosure, the spacers 124 having a reverse taper structure may be provided on the bank 122, and the organic patterns 145 may be provided on the spacers 124. Therefore, the capping layer CPL may be formed in the transmissive area TA to at least partially surround the side surfaces of each of the spacers 124 having a reverse taper structure as well as the upper surface of each of the organic patterns 145. Furthermore, the capping layer CPL may be formed to at least partially cover the upper surface of the bank 122.

The capping layer CPL may be in contact with the side surfaces of each of the spacers 124 and the upper surface of the bank 122 in addition to the upper surface of each of the organic patterns 145, which has a weak adhesive force, thereby increasing a lower bounding force. As a result, the adhesive force between the capping layer CPL and the spacers 124 and the adhesive force between the capping layer CPL and the bank 122 may prevent the capping layer CPL from being separated from the organic patterns 145 when the protective film 170 is removed. Therefore, yield and reliability of the display device 100 may be improved.

In FIG. 3, the encapsulation layer 160 is formed directly on the capping layer CPL, but is not limited thereto. In another embodiment, a first inorganic passivation layer 150 may be further included between the encapsulation layer 160 and the capping layer CPL as shown in FIG. 8. The first inorganic passivation layer 150 may be formed in the transmissive area TA as well as the non-transmissive area NTA, and may be a transparent inorganic layer such as indium zinc oxide (IZO). The first inorganic passivation layer 150 may be deposited through a sputtering process, thereby increasing a binding force with the capping layer CPL. The capping layer CPL may reduce a force, which acts on an interface with the organic patterns 145 when the protective film 170 is removed, by a binding force with the first inorganic passivation layer 150 deposited thereon.

Meanwhile, in FIG. 8, the first inorganic passivation layer 150 is provided between the encapsulation layer 160 and the capping layer CPL, but is not limited thereto.

In another embodiment, a second inorganic passivation layer 155 may be provided on the second electrode 140 and the plurality of organic patterns 145, as shown in FIG. 9. In detail, the second inorganic passivation layer 155 may be disposed between the capping layer CPL and the organic patterns 145 in the transmissive area TA. The second inorganic passivation layer 155 may be formed to at least partially cover the upper surface and side surfaces of each of the organic patterns 145. The second inorganic passivation layer 155 may be a transparent inorganic layer such as indium zinc oxide (IZO). The second inorganic passivation layer 155 may be formed to at least partially surround the plurality of organic patterns 145 while being deposited through a sputtering process. The second inorganic passivation layer 155 may have a larger binding force with the organic patterns 145 than the capping layer CPL in view of the sputtering process.

In addition, the second inorganic passivation layer 155 may be provided in the non-transmissive area NTA as well as the transmissive area TA. The second inorganic passivation layer 155 may be provided between the second electrode 140 and the capping layer CPL in the non-transmissive area NTA, and may at least partially cover the second electrode 140. The second inorganic passivation layer 155 may be formed in the non-transmissive area NTA to at least partially surround the upper surface and side surfaces of the second electrode 140. When the second inorganic passivation layer 155 is formed of IZO, the second inorganic passivation layer 155 that is in contact with the second electrode 140 may serve as a cathode electrode together with the second electrode 140. Therefore, in the display panel 110 shown in FIG. 9, resistance of the cathode electrode may be reduced.

The capping layer CPL may be provided on the second inorganic passivation layer 155. At this time, since the second inorganic passivation layer 155 at least partially surrounds the organic patterns 145, the capping layer CPL may not be in contact with the organic patterns 145. Therefore, the display panel 110 shown in FIG. 9 may increase the binding force between the capping layer CPL and the lower elements more greatly than the display panel 110 shown in FIG. 3.

Meanwhile, the display panel 110 shown in FIGS. 3, 8 and 9 may move to a place where a subsequent process is performed, in a state that the protective film 170 is attached thereto. After the protective film 170 is removed from the first substrate 111, the subsequent process may be performed.

Figure 10:
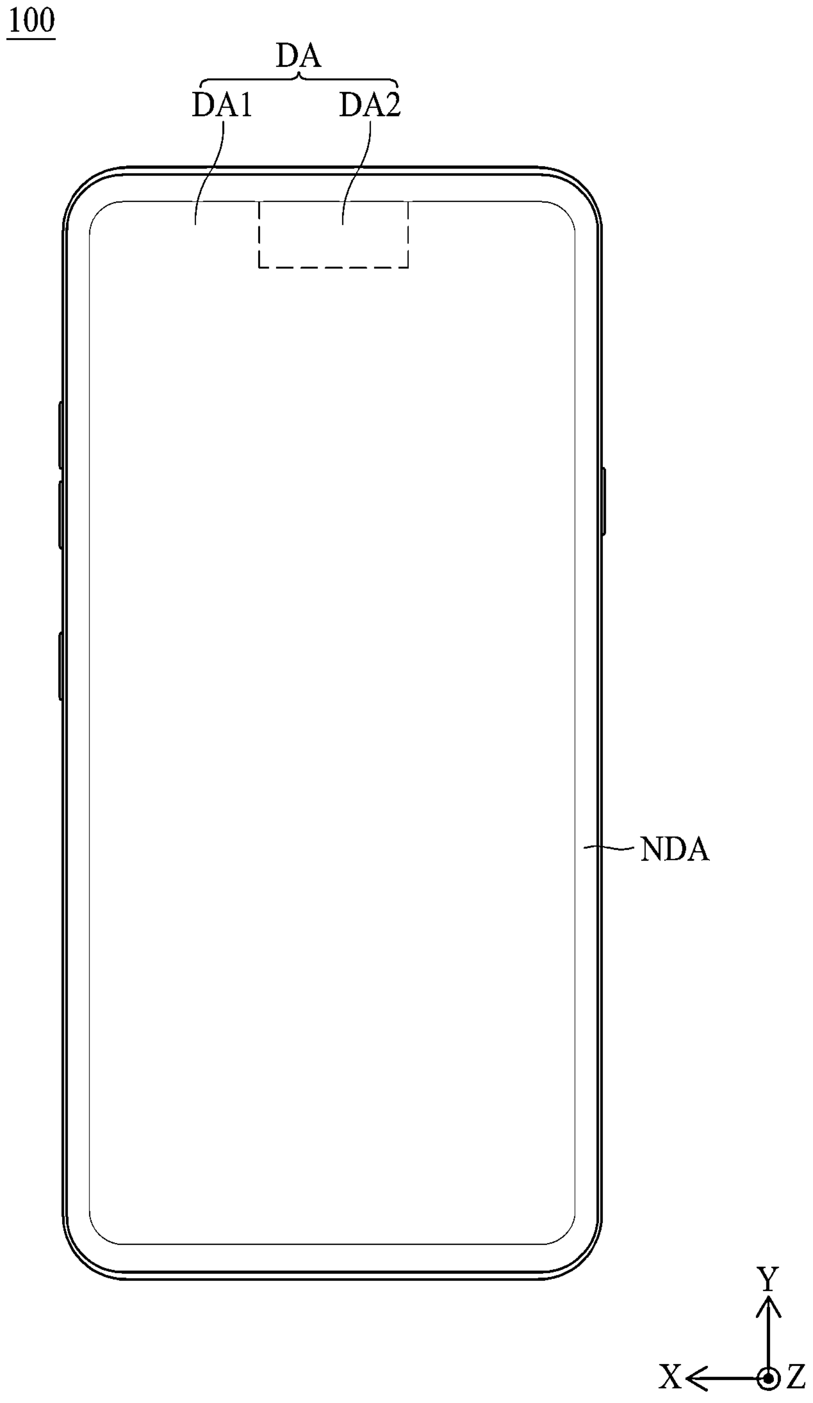
FIG. 10 is a schematic plan view illustrating a display device according to another example embodiment of the present disclosure.

The above-described display panel 110 may be applied to a display device comprising an optical sensor. FIG. 10 is a schematic plan view illustrating a display device according to another example embodiment of the present disclosure, and FIG. 11 is an exploded view illustrating a display device according to another example embodiment of the present disclosure.

Figure 11:
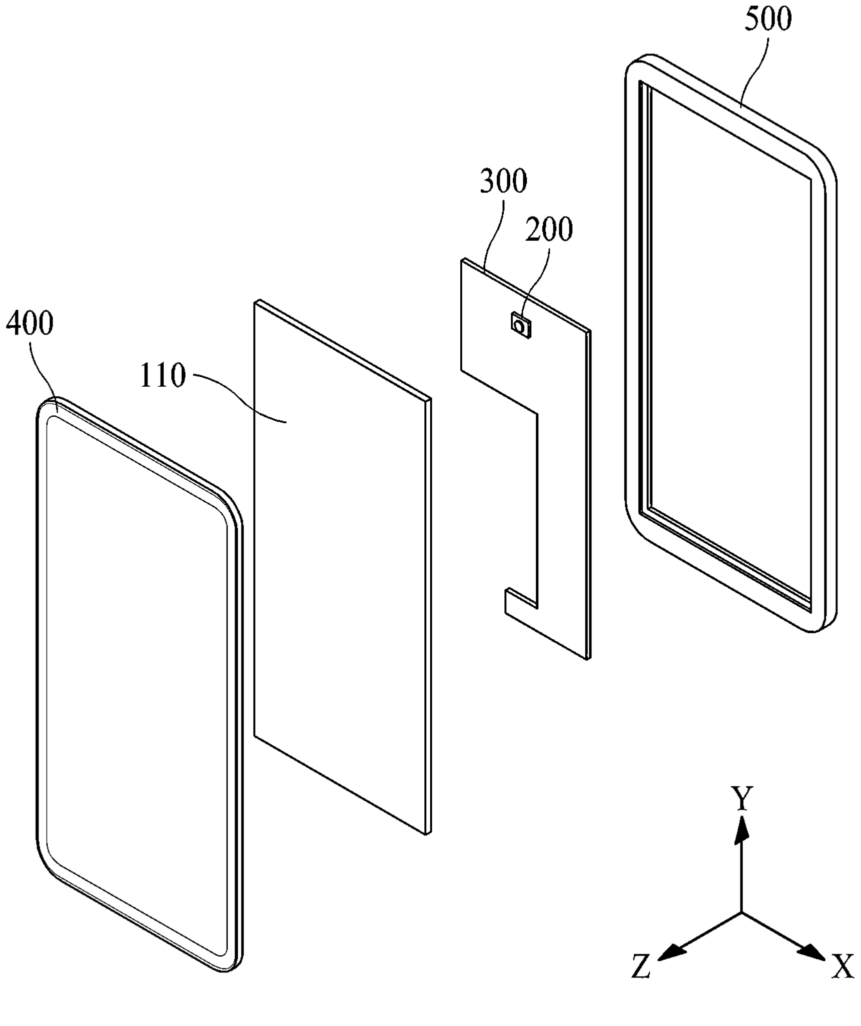
FIG. 11 is an exploded view illustrating a display device according to another example embodiment of the present disclosure.

With reference to FIGS. 10 and 11, the display device 100 according to another example embodiment of the present disclosure may include a display panel 110, an optical sensor 200, a circuit board 300, a cover window 400 and a frame 500.

The display panel 110 may be categorized into a display area DA in which pixels are formed to display an image and a non-display area NDA in which an image is not displayed. The non-display area NDA may be disposed to surround the display area DA. In the non-display area NDA, a driver for supplying various signals to a plurality of signal lines in the display area DA and a link portion for connecting the driver with the plurality of signal lines may be formed. The driver may include a gate driver for supplying a gate signal to a gate line and a data driver for supplying a data signal to a data line.

The display area DA includes a first display area DA1 and a second display area DA2. The first display area DA1 is an area in which a plurality of first pixels are disposed and display an image while emitting light regardless of whether the optical sensor 200 is operated. The first display area DA1 may not include the transmissive area TA shown in FIGS. 1 to 9, but is not limited thereto. When the transmissive area TA is not provided, the first display area DA1 may not include the plurality of spacers 124 and the plurality of organic patterns 145, which are shown in FIGS. 1 to 9. Therefore, the second electrode 140 provided in the first display area DA1 is not provided with the opening area OA, and may be formed in the entire first display area DA1. The plurality of first pixels disposed in the first display area DA1 may not be provided with the transmissive area TA, thereby having a high aperture ratio.

The second display area DA2 is disposed to overlap the area in which the optical sensor 200 is disposed. A plurality of second pixels may be disposed in the second display area DA2, and whether an image is displayed may be determined depending on whether the optical sensor 200 is operated.

In detail, when the operation of the optical sensor 200 is turned off, the plurality of second subpixels may be turned on. Therefore, an image may be displayed on the second display area DA2 as the plurality of second subpixels emit light.

On the other hand, when the operation of the optical sensor 200 is turned on, the plurality of second subpixels may be turned off. Therefore, an image may not be displayed on the second display area DA2, and external light may be input to the optical sensor 200.

The optical sensor 200 may measure external light while periodically repeating an on-off operation. In addition, the plurality of second subpixels may display an image on the second display area DA2 while periodically repeating the on-off operation. The display panel 110 may turn on or off the optical sensor 200 and the plurality of second subpixels at a period that cannot be recognized by a user. Therefore, the user may recognize that the image is displayed on the second display area DA2 as well as the first display area DA1 and at the same time the optical sensor 200 operates.

The second display area DA2 should be provided with the transmissive area TA shown in FIGS. 1 to 9 so that external light enters the optical sensor 200 by transmitting the display panel 110. Therefore, the pixels shown in FIGS. 1 to 9 may be disposed in the second display area DA2.

The optical sensor 200 may be disposed on a rear surface of the display panel 110. The optical sensor 200 may be provided to overlap the display area DA of the display panel 110, particularly the second display area DA2. The optical sensor 200 may mean all elements that measure external light input through the display panel 110 and use the measured external light. For example, the optical sensor 200 may be a camera, but is not limited thereto. The optical sensor 200 may be an infrared sensor, an illuminance sensor, a fingerprint sensor or the like.

The circuit board 300 may be disposed on the rear surface of the display panel 110. The circuit board 300 may be a printed circuit board (PCB) or a flexible printed circuit board (FPCB).

The cover window 400 may be disposed on a front surface of the display panel 110. The cover window 400 may protect the display panel 110 from external impact by covering the front surface of the display panel 110. The cover window 400 may include a transparent plastic material, a glass material or a reinforced glass material.

The frame 500 may accommodate the display panel 110 and support the cover window 400. The frame 500 may include an accommodating portion that may accommodate the optical sensor 200 and the circuit board 300. The frame 500 allows the display panel 110, the optical sensor 200 and the circuit board 300 to be fixed to the display device 100. Also, the frame 500 may serve to protect the display panel 110, the optical sensor 200 and the circuit board 300 from impact.

According to the present disclosure, the following example advantageous effects may be obtained.

In the present disclosure, the organic pattern formed of a material that enables desorption of a metal material is formed in the transmissive area, whereby the second electrode may not be deposited on the transmissive area. Therefore, the present disclosure may improve light transmittance in the transmissive area.

Also, in the present disclosure, the organic pattern is formed on the upper surface of the spacer having a reverse taper structure, so that the capping layer may be in contact with the upper surface of the bank as well as the side surfaces of the spacer. As a result, the binding force between the capping layer and the lower elements may be increased.

The present disclosure may prevent the capping layer from being separated from the organic patterns when the protective film is removed. Therefore, the present disclosure may improve yield and reliability of the display device.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising a substrate having at least two transmissive areas and a non-transmissive area disposed between the at least two transmissive areas;

a subpixel in the non-transmissive area, the subpixel including a first electrode, a light emitting layer, and a second electrode;

at least two spacers each in a respective one of the at least two transmissive areas; and at least two organic patterns each on a respective upper surface of a respective one of the at least two spacers, wherein the second electrode is not disposed on the at least two organic patterns.

2. The display device according to claim 1, wherein each spacer has an upper surface wider than a lower surface thereof.

3. The display device according to claim 1, wherein the at least two organic patterns include a material that enables desorption of a metal material.

4. The display device according to claim 3, wherein the at least two organic patterns include a photoisomerization material.

5. The display device according to claim 1, further including a capping layer over the subpixel and the at least two organic patterns.

6. The display device according to claim 5, further including an encapsulation layer on the capping layer.

7. The display device according to claim 5, wherein the capping layer at least partially covers the upper surface of each of the at least two organic patterns and a side surface of each of the at least two spacers.

8. The display device according to claim 6, further comprising an inorganic passivation layer between the encapsulation layer and the capping layer.

9. The display device according to claim 1, further comprising a bank in each of the at least two transmissive areas, each of the at least two spacers being on a respective bank.

10. The display device according to claim 9, wherein each bank partially covers an edge of the first electrode such that each bank is absent on a central portion of the first electrode.

11. The display according to claim 1, wherein an upper surface of each of the at least two organic patterns has a same shape as an upper surface of each of the at least two spacers.

12. The display device according to claim 1, wherein upper surfaces of the at least two organic patterns and the at least two spacers have a cross shape.

13. The display device according to claim 1, wherein upper surfaces of the at least two organic patterns and the at least two spacers have a circular shape.

14. The display device according to claim 1, wherein upper surfaces of the at least two organic patterns and the at least two spacers have a rectangular shape.

15. The display device according to claim 1, further comprising an inorganic passivation layer on the second electrode and the at least two organic patterns such that the inorganic passivation layer at least partially covers upper surfaces and side surfaces of the at least two organic patterns.

16. The display device according to claim 1, wherein the second electrode is spaced apart from the at least two organic patterns.

17. The display device according to claim 1, wherein the second electrode includes an opening overlapped with at least a portion of one of the at least two transmissive areas.

18. The display device according to claim 1, wherein the second electrode includes a semi-transmissive metal material or an opaque metal material.

19. The display device according to claim 1, wherein the second electrode includes at least one of Ag or Mg.

20. The display device according to claim 1, further comprising an optical sensor disposed under the substrate, wherein the optical sensor overlaps the at least two transmissive areas and the non-transmissive area.

* * * * *